(12) United States Patent
Johler et al.

(10) Patent No.: US 11,303,188 B2
(45) Date of Patent: Apr. 12, 2022

(54) ELECTROMAGNETIC INTERFERENCE SUPPRESSION COMPONENT AND PROTECTION COMPONENT ASSEMBLY FOR A MOTOR

(71) Applicants: Littelfuse Electronics (Shanghai) Co., Ltd., Shanghai (CN); Littelfuse France SAS, Paris (FR)

(72) Inventors: Werner Johler, Shanghai (CN); Philippe Di Fulvio, Paris (FR)

(73) Assignees: LITTELFUSE ELECTRONICS (SHANGHAI) CO., LTD., Shanghai (CN); LITTELFUSE FRANCE SAS, Paris (FR)

(*) Notice: Subject to any disclaimer, the term of this patent is extended or adjusted under 35 U.S.C. 154(b) by 419 days.

(21) Appl. No.: 16/545,286

(22) Filed: Aug. 20, 2019

(65) Prior Publication Data

US 2019/0379259 A1 Dec. 12, 2019

Related U.S. Application Data

(62) Division of application No. 15/299,823, filed on Oct. 21, 2016, now Pat. No. 10,447,117.

(30) Foreign Application Priority Data

Oct. 22, 2015 (EP) .................................. 15306694

(51) Int. Cl.
| | |
|---|---|
| *H02K 11/02* | (2016.01) |
| *H02K 11/25* | (2016.01) |
| *H02K 11/27* | (2016.01) |
| *H02K 5/02* | (2006.01) |
| *H02K 5/22* | (2006.01) |
| *H02K 23/00* | (2006.01) |

(Continued)

(52) U.S. Cl.
CPC .............. *H02K 11/02* (2013.01); *H01G 2/22* (2013.01); *H01G 4/35* (2013.01); *H02K 5/02* (2013.01); *H02K 5/225* (2013.01); *H02K 11/25* (2016.01); *H02K 11/27* (2016.01); *H02K 23/00* (2013.01); *H03H 1/00* (2013.01); *H01G 4/40* (2013.01); *H02H 9/026* (2013.01); *H02H 9/044* (2013.01); *H02K 2213/03* (2013.01)

(58) Field of Classification Search
CPC .. H02K 11/022; H02K 11/024; H02K 11/026; H02K 11/028; H02K 11/02; H02K 11/25; H02K 11/27; H02K 5/02; H02K 5/225; H02K 23/00; H05K 9/0039; H05K 1/0215
USPC ............................... 310/68 C, 68 R; 361/799
See application file for complete search history.

(56) References Cited

U.S. PATENT DOCUMENTS

| 5,647,768 A | 7/1997 | Messuri et al. |
| 6,157,528 A | 12/2000 | Anthony |

(Continued)

*Primary Examiner* — Jeremy A Luks
(74) *Attorney, Agent, or Firm* — Kacvinsky Daisak Bluni PLLC (57) ABSTRACT

An electromagnetic interference (EMI) circuit assembly includes a first, second, and third conductive layer. A protection component disposed between the first and second conductive layers. A dielectric layer is disposed between the second and the third conductive layers. The protection component is configured to protect a load from one or both of an overcurrent condition and an over temperature condition, and the third layer define a capacitor configured to suppress EMI signals.

8 Claims, 7 Drawing Sheets

(51) Int. Cl.
*H03H 1/00* (2006.01)
*H01G 2/22* (2006.01)
*H01G 4/35* (2006.01)
H02H 9/04 (2006.01)
*H01G 4/40* (2006.01)
H02H 9/02 (2006.01)

(56) References Cited

U.S. PATENT DOCUMENTS

| | | |
|---|---|---|
| 7,002,217 B2 * | 2/2006 | Hollingsworth ...... H01L 23/552 |
| | | 257/355 |
| 9,178,485 B2 | 11/2015 | Nardin |
| 9,941,773 B2 | 4/2018 | Freimuth |
| 2006/0048029 A1 | 3/2006 | Kobayashi |
| 2006/0175916 A1 | 8/2006 | Thomson |
| 2007/0210672 A1 | 9/2007 | Fleminger |
| 2014/0035718 A1 * | 2/2014 | Tseng .................. H01C 1/1406 |
| | | 338/22 R |
| 2014/0077923 A1 | 3/2014 | Bourns |
| 2014/0334050 A1 | 11/2014 | Henke |
| 2018/0069456 A1 | 3/2018 | Osborne |
| 2018/0156638 A1 | 6/2018 | Liu |

\* cited by examiner

ELECTROMAGNETIC INTERFERENCE SUPPRESSION COMPONENT AND PROTECTION COMPONENT ASSEMBLY FOR A MOTOR

CROSS-REFERENCE

This application is a divisional of, and claims priority to, pending U.S. non-provisional patent application Ser. No. 15/299,823, filed Oct. 21, 2016, which claims priority to EP15306694.9, filed Oct. 22, 2015, the entirety of which applications are incorporated by reference herein.

FIELD

The present invention relates generally to electromagnetic interference (EMI) circuits and protection devices. More specifically, the present invention relates to an electromagnetic interference suppression component and protection component assembly for a motor.

DESCRIPTION OF RELATED ART

Motors, especially DC motors that utilize brushes to drive a commutator, are known to generate electrical noise (i.e., electromagnetic interference or EMI) capable of interfering with the operation of nearby electronic equipment. To alleviate EMI problems, the motors may be fitted with various types of filters specifically configured to reduce the EMI to acceptable levels.

Figure 1:
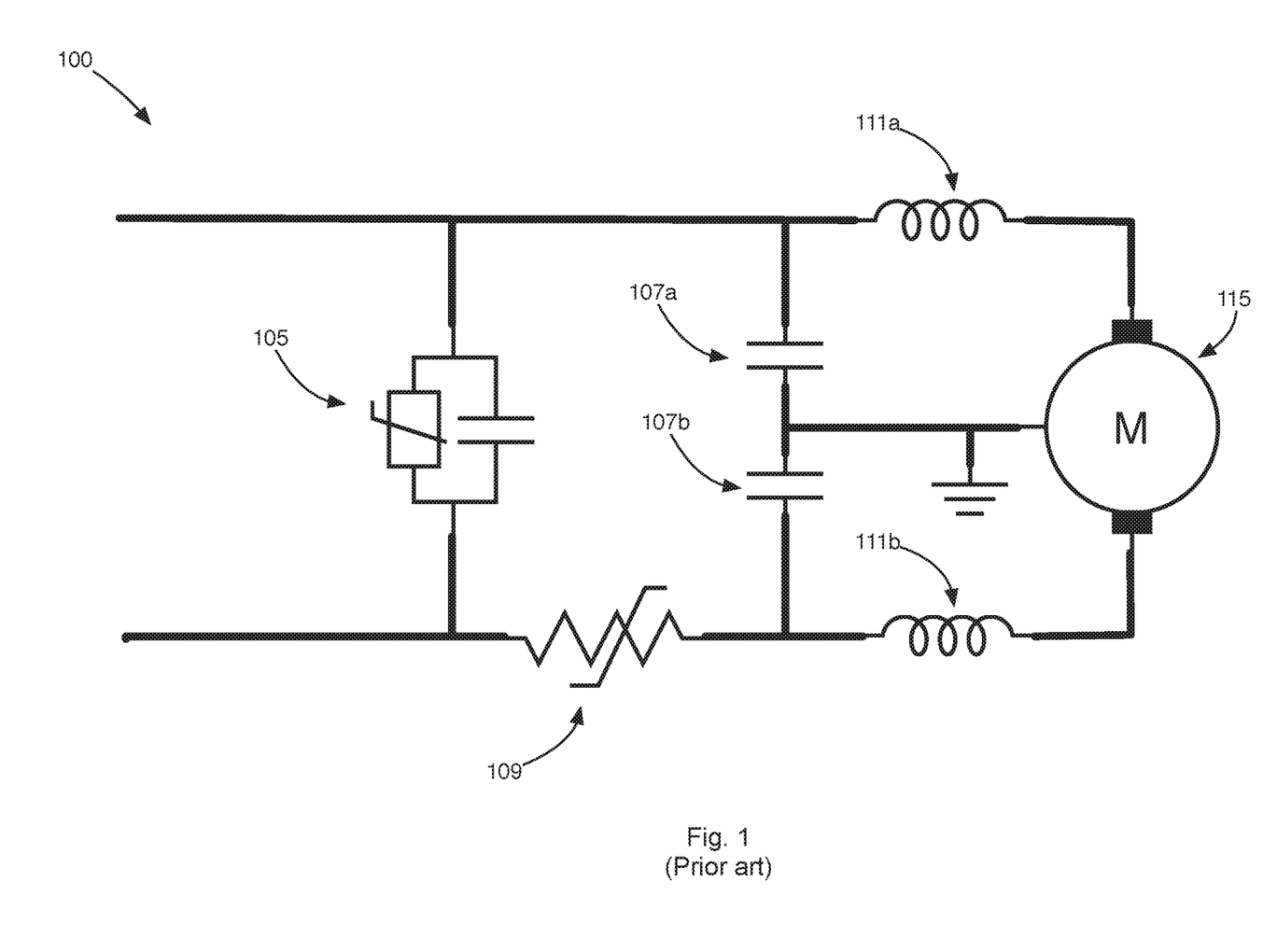
FIG. 1 illustrates an exemplary schematic diagram of a prior art motor assembly that includes filter components, protection components, and a motor.

FIG. 1 illustrates a schematic diagram of a motor assembly 100 that includes an EMI filter circuit that may be electrically coupled to a motor 115 to reduce EMI generated by the motor 115. The EMI filter circuit includes a pair of capacitors 107ab and a pair of coils or chokes 111ab that together cooperate to suppress or reduce the EMI noise generated by the motor 115.

In addition to EMI filter circuits, the motor assembly 100 may include various protection components 105 and 109 to protect the motor 115 against over current conditions, overheating, over voltage, etc. For example, a protection device, such as polymeric positive temperature coefficient (PPTC) device 109, bi-metal device, thermal cutout (TCO) device, etc., may be inserted in series with a power lead of the motor 115. The PPTC component 109 may correspond to a nonlinear device with a resistance that changes in relation to the temperature of the PPTC component 109. The bi-metal device and thermal cutout device may include a pair of metal strips in contact with one another that separate above a set temperature. The bi-metal device may be resettable type of fuse device, whereas the thermal cutout device may be a single shot device (i.e., a non-resettable fuse device). A varistor 105 may be inserted in parallel with the power leads of the motor 115. The varistor 105 may be utilized to protect against excessive transient voltages that might damage the motor 115.

During the manufacturing process of the motor assembly 100, the various components discussed above are connected together via leads of various lengths to form the circuit illustrated in FIG. 1. The assembled components may then be inserted into a metal motor housing. Ground nodes illustrated in the schematic may be electrically coupled to the motor housing.

One problem with this approach is that the leads between the various components tend to act as antennae, which exacerbates EMI issues. Accordingly, noise generated by these leads has to be taken into consideration in the selection of values for the capacitors 107ab and chokes 111ab.

In addition, assembling the various components may be complex, especially for small motor housings that provide very confined spaces for placement of the components. This complexity increases assembly time and the likelihood of manufacturing defects. This, in turn, necessarily increases manufacturing costs of the motor assembly.

Other problems with existing motor assemblies will become apparent in view of the disclosure below.

SUMMARY

In one aspect, an electromagnetic interference (EMI) circuit assembly includes a first, second, and third conductive layer. A protection component is disposed between the first and second conductive layers. A dielectric layer is disposed between the second and the third conductive layers. The protection component is configured to protect a load from one or both of an overcurrent condition and an over temperature condition, and the third layer define a capacitor configured to suppress EMI signals.

In a second aspect, an electromagnetic interference (EMI) circuit assembly includes a first, second, third, fourth and fifth conductive layer. A first dielectric layer is disposed between the first and the second conductive layers to thereby define a first capacitor. A voltage-dependent resistive material layer is disposed between the second and the third conductive layers to thereby define a varistor. A second dielectric layer is disposed between the third and the fourth conductive layers to thereby define a second capacitor. A protection component is disposed between the third and the fifth conductive layers and is configured to protect a load from one or both of an overcurrent condition and an over temperature condition.

DETAILED DESCRIPTION

Figure 2:
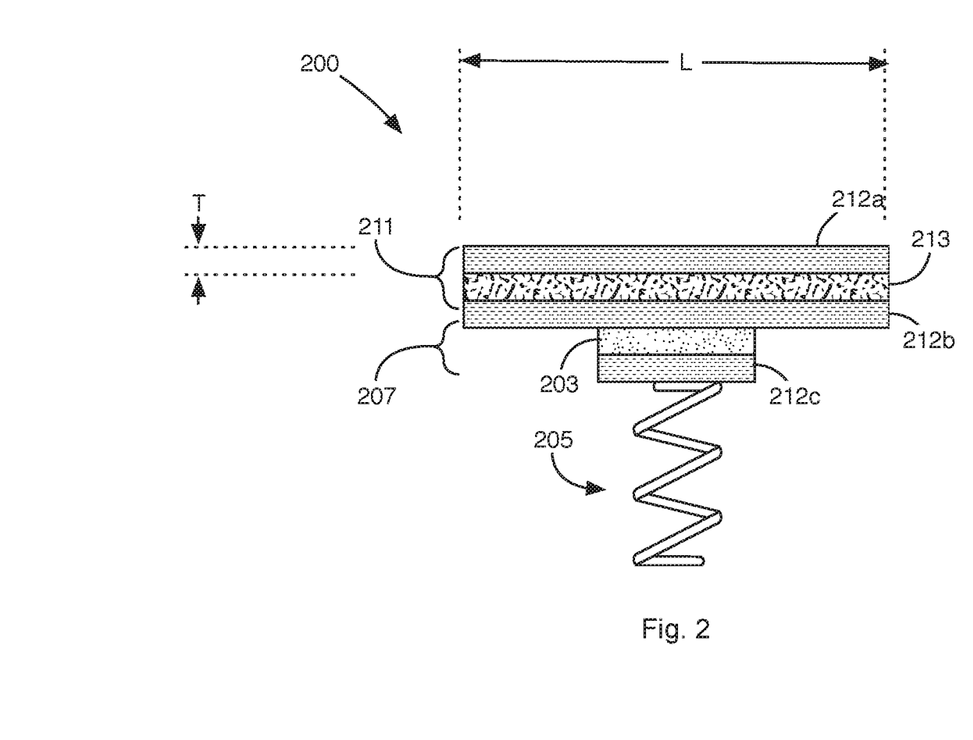
FIG. 2 illustrates a first embodiment of an exemplary electromagnetic interference suppression component and protection component assembly.

FIG. 2 illustrates a first embodiment of an exemplary electromagnetic interference suppression component and protection component assembly 200. The assembly 200 includes first and second conductive layers 212ab, and a polymeric positive temperature coefficient (PPTC) material layer 213 disposed between the first and second conductive layers 212ab. The assembly 200 also includes a third conductive layer 212c and a dielectric layer 203 disposed between the second and third conductive layers 212bc.

The first conductive layer 212a, PPTC material layer 213, and second conductive layer 212b define a PPTC component 211 configured to limit current to a load. For example, the PPTC material layer 213 may correspond to a material that exhibits non-linear changes in resistance with changes in temperature such as 125° C., 165° C., 180° C., or other, or a different material with similar characteristics. The first and second conductive layers 212ab may be formed from a material such as copper, copper steel, Brass or a different material with similar characteristics. The first and second conductive layers 212ab may have a thickness, T, of between about 0.5 mm-0.8 mm, a length, L, of between about 12 mm-17 mm, and a width between about 8 mm and 13 mm other. The PPTC material layer 213 may have a thickness of between about 10 mils and 15 mils, a length of between about 12 mm and 17 mm or other, and a width of between about 8 mm and 13 mm. It should be understood that the dimensions of the first and second conductive layers 212ab may be different from one another and that the dimensions of the various layers may be selected to provide a PPTC component 211 with specified characteristics such as a specified operation temperature and current limit to control the operating point at which the PPTC component 211 begins to limit current flow.

In alternative embodiments, the PPTC material layer 213 may be replaced with a bi-metal device or a TCO device that opens when the device exceeds a set temperature such as 130° C., 140° C., or a different temperature. Other protection devices may be utilized in addition to or in place of the PPTC material layer 213.

The second conductive layer 212b, dielectric layer 203, and third conductive layer 212c form a capacitor 207 with characteristics selected to cooperate with other components of a motor assembly to reduce or suppress EMI signals. For example, the dielectric layer 203 may correspond to a material such as ceramic film, and/or polymer or a different material with similar characteristics. The capacitor may possess the characteristics of a ceramic capacitor, a foil capacitor, a tantalum capacitor, or a different type of capacitor. The dimensions of the third conductive layer 212c may the same as those of the first conductive layer 212a or different. The third conductive layer 212c may be formed from the same material as the first conductive layer 212. In alternate implementations, one or both of the second and third conductive layers 212bc may correspond to a ceramic substrate upon which a silver ink paste is sintered. The layers may correspond to a foil/paper layer terminated with a silver epoxy and then nickel tin plating. The layers may be formed of a different material with similar characteristics. The dielectric layer 203 may have a thickness of about 0.02 to 0.1 mm or other, a length of about 10 mm, and width of about 10 mm. It should be understood that the dimensions of the various layers may be selected to provide a capacitor with specified characteristics such as a specified capacitance, impedance, current carrying capacity, voltage tolerance, etc.

In some implementations, a resilient member 205 may be electrically coupled to the third conductive layer 212c to facilitate coupling one side of the capacitor 207 to a ground node of a motor housing of a motor assembly. For example, the resilient member 205 may correspond to a coil spring, a clip-like spring, or a different resilient structure. The resilient member 205 is configured to facilitate insertion of the assembly 200 into a motor housing while simultaneously providing a durable electrical connection between the third conductive layer 212c and the motor housing to ground the capacitor 207. For example, an operator may compress the resilient member 205 to facilitate insertion of the assembly 200 into the motor housing. Once inserted, the resilient member 205 may expand to contact an interior conductive surface of the motor housing.

Figure 3:
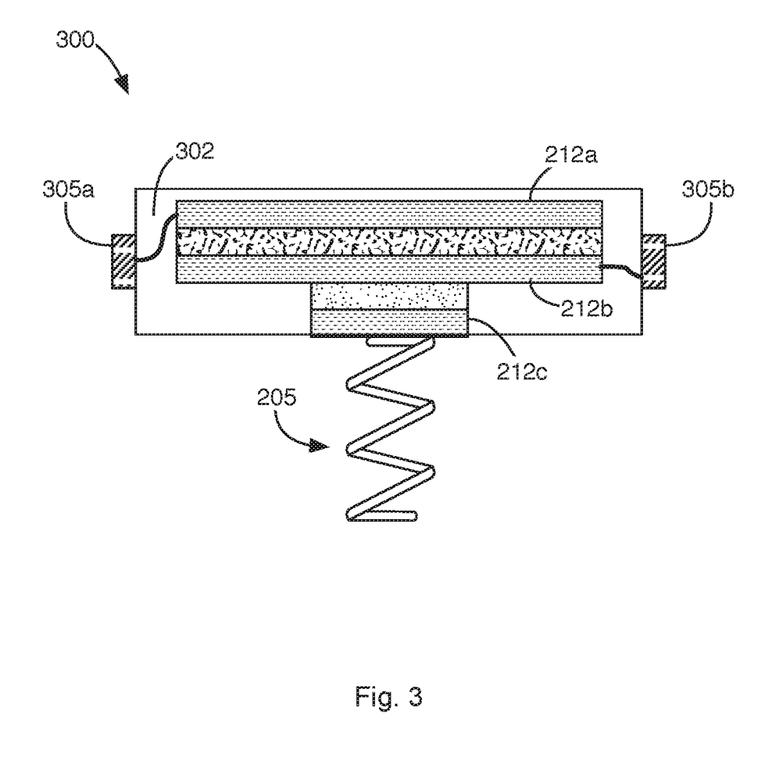
FIG. 3 illustrates a first device that includes the assembly of FIG. 2.

FIG. 3 illustrates a device 300 that includes the assembly 200 illustrated in FIG. 2 and an encapsulating material 302 that surrounds part or all of the various layers that form the assembly 200. The encapsulating material 302 may correspond to a material with a high dielectric constant capable of withstanding the environmental conditions in which the device is intended to operate. For example, the encapsulating material 302 may correspond to plastic, PPS, LCP, Polymide, Polymer PTFE, or a different material with similar characteristics.

First and second terminals 305ab may be provided on the outside of the encapsulating material 302. The terminals 305ab may comprise a conductive material that, for example, may be formed via a deposition method on the edges of the encapsulating material 302. Alternatively, the terminals 305ab may correspond to pre-formed parts that are partially encapsulated during an encapsulation process.

Bond wires may be included within the encapsulating material 302 to electrically couple the conductive layers 212ab of the assembly 200 to the terminals 305ab. In the exemplary embodiment, the first conductive layer 212a of the assembly may be coupled to a first terminal 305a and the second conductive layer 212b of the assembly 200 may be coupled to the second terminal 305b.

In some implementation, the resilient member 205 may be coupled to the third conductive layer 212 prior to encapsulation. The encapsulating material 302 may cover the portion of the resilient member 205 that is coupled to the third conductive layer 212 while the rest of the resilient member 205 is allowed to protrude.

In alternate implementations, a third terminal (not shown), similar to the first and second terminals 305ab, may be provided on the outside of the encapsulating material 302 and electrically coupled to the third conductive layer 212c. In a second process, the resilient member 205 may be soldered, welded, etc., to the third terminal. Alternatively, the resilient member 205 may be pressed up against the terminal when the device 300 is inserted into a motor housing and subsequently released when the device 300 is in the appropriate position within the motor housing. The resilient member 205 may then expand to provide an electrical connection between the third terminal and the motor housing.

Figure 4:
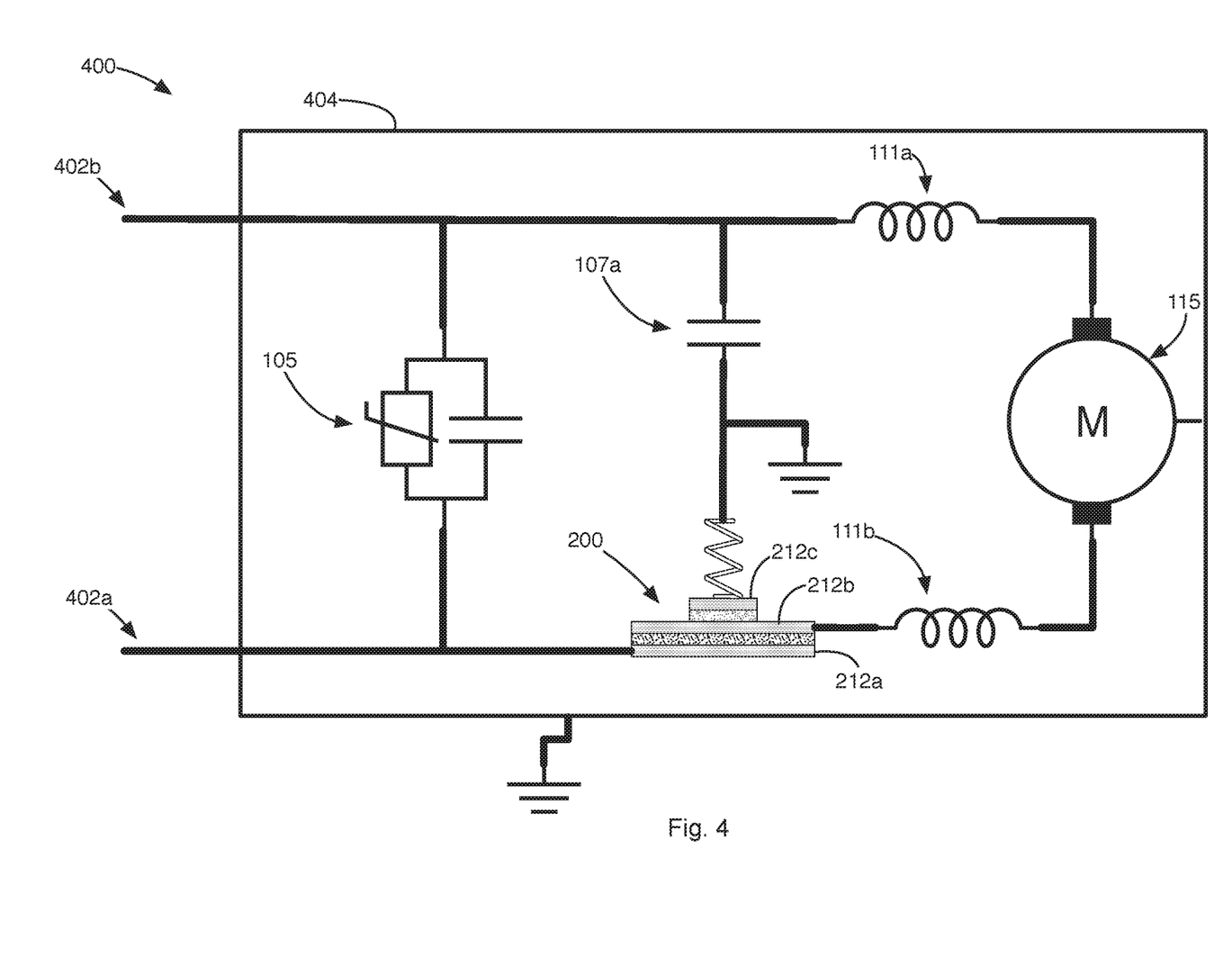
FIG. 4 is an exemplary schematic diagram of a first motor assembly that illustrates the connections between the assembly of FIG. 2 and a motor.

FIG. 4 illustrates is an exemplary schematic diagram of a motor assembly 400 which illustrates the connections between the assembly 200 of FIG. 2, a motor 115, and a conductive motor housing 404. As shown, the first conductive layer 212a of the assembly 200 may be electrically coupled to a first terminal 402a of the motor assembly 400 and the second conductive layer 212b may be electrically coupled to one end of a choke 111b that is coupled to a first terminal of a motor 115. The first and second conductive layers 212ab and the PPTC material disposed between them may perform the function of the PPTC component 109 illustrated in FIG. 1.

The third conductive layer 212c may be electrically coupled to a ground node of the motor assembly 400 (e.g., the motor housing 404). The second and third conductive layers 212bc and the dielectric material disposed between them may perform the function of capacitor 107b illustrated in FIG. 1.

As shown, the assembly 200 advantageously replaces two components of the known system with one. This in turn reduces the number of leads normally required to couple the replaced components, which necessarily reduces the number of steps required to manufacture the motor assembly. EMI is further reduced by reducing the number of leads between components.

Figure 5:
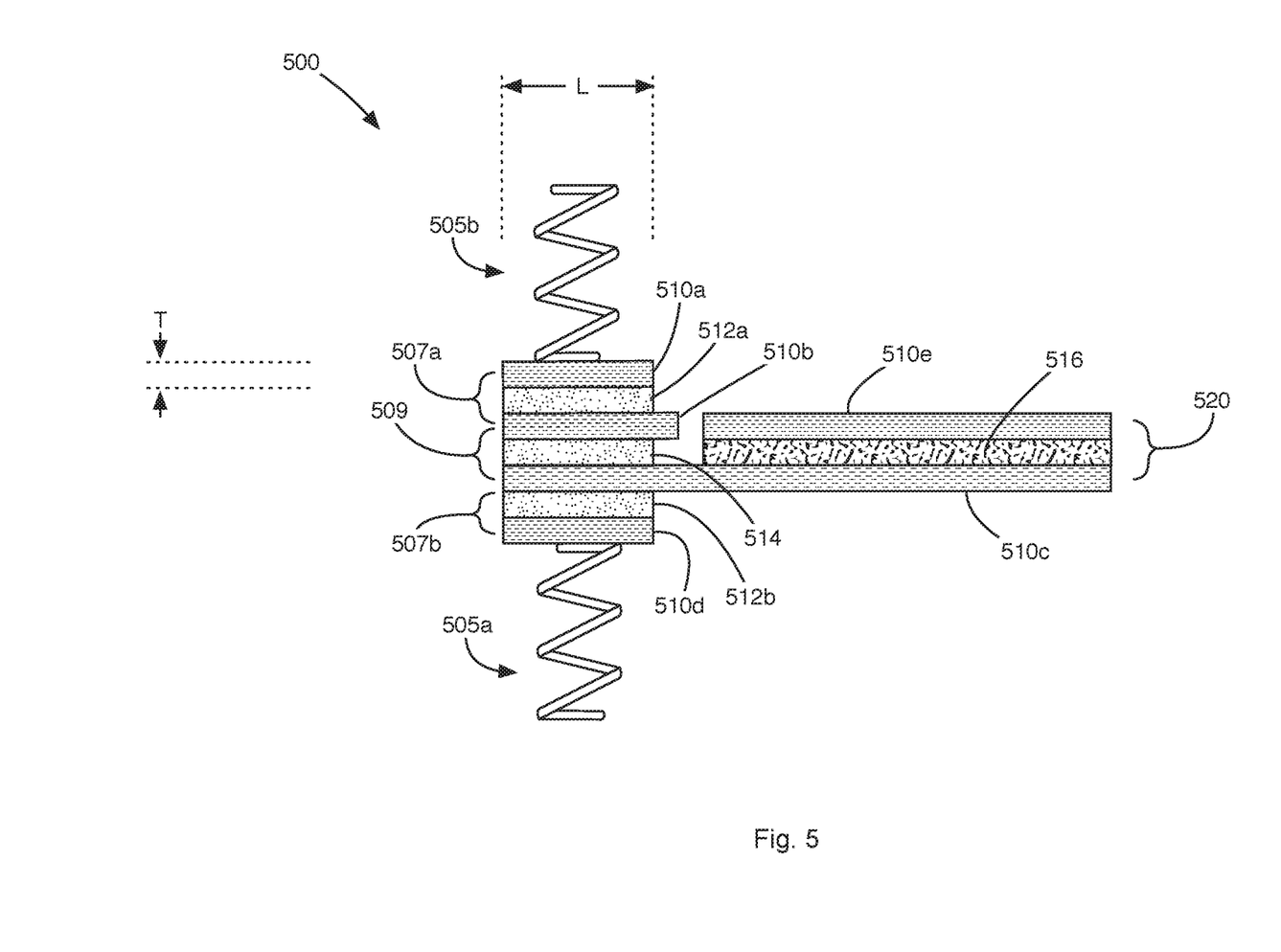
FIG. 5 illustrates a second embodiment of an exemplary electromagnetic interference suppression component and protection component assembly.

FIG. 5 illustrates a second embodiment of an exemplary electromagnetic interference suppression component and protection component assembly 500. The assembly 500 includes first through fifth conductive layers 510a-e, a first dielectric layer 512a disposed between the first and second conductive layers 510a and 510b, a voltage-dependent resistive material layer 514 disposed between the second and third conductive layers (510b and 510c), a second dielectric layer 512b disposed between the third and fourth conductive layers (510c and 510d), and a polymeric positive temperature coefficient (PPTC) material layer 516 disposed between the third and fifth conductive layers (510c and 510e).

The first conductive layer 510a, first dielectric layer 512a, and second conductive layer 510b form a first capacitor 507a, and the third conductive layer 510c, second dielectric layer 512b, and fourth conductive layer 510d form a second capacitor 507b. The capacitors 507ab have characteristics selected to cooperate with other components of a motor assembly to reduce or suppress EMI signals. For example, the dielectric layers 512ab may correspond to a material such as ceramic, film, and/or polymer or a different material with similar characteristics. The first, second, and fourth conductive layers 510ab and 510d may be formed from a material such as copper, Cu plated steel, brass, or a different material with similar characteristics. As noted above, the dimensions of the respective conductive layers 510ab and the dielectric layers 512ab may be selected to provide first and second capacitors 507ab having specified characteristics such as a specified capacitance, impedance, current carrying capacity, voltage tolerance, etc.

The second conductive layer 510b, voltage-dependent resistive material layer 514, and third conductive layer 510c form a varistor 509. The voltage-dependent resistive material layer 514 may correspond to a metal oxide varistor material or a material with similar characteristics. The dimensions of the voltage-dependent resistive material layer 514 may be selected to provide a varistor 509 having specified characteristics such as a specified voltage at which the varistor begins to conduct.

The third conductive layer 510c, PPTC material layer 516, and fifth conductive layer 510e define a PPTC component 520 configured to limit current to a load. For example, the PPTC material layer 520 may correspond to the material described above or a different material with similar characteristics. As noted above, the dimensions of the various layers that form the PPTC component 520 may be selected to have specified characteristics.

In alternative embodiments, the PPTC material layer 516 may be replaced with a bi-metal device or a TCO device that opens when the device exceeds a set temperature such as 130° C., 140° C., or a different temperature. Other protection devices may be utilized in addition to or in place of the PPTC material layer 213.

Similar to above, first and second resilient members 505ab may be electrically coupled to the first conductive layer 510a and the fourth conductive layer 510d, respectively, to facilitate coupling a terminal of the first capacitor 507a and a terminal of the second capacitor 507b to a ground node of a motor housing.

Figure 6:
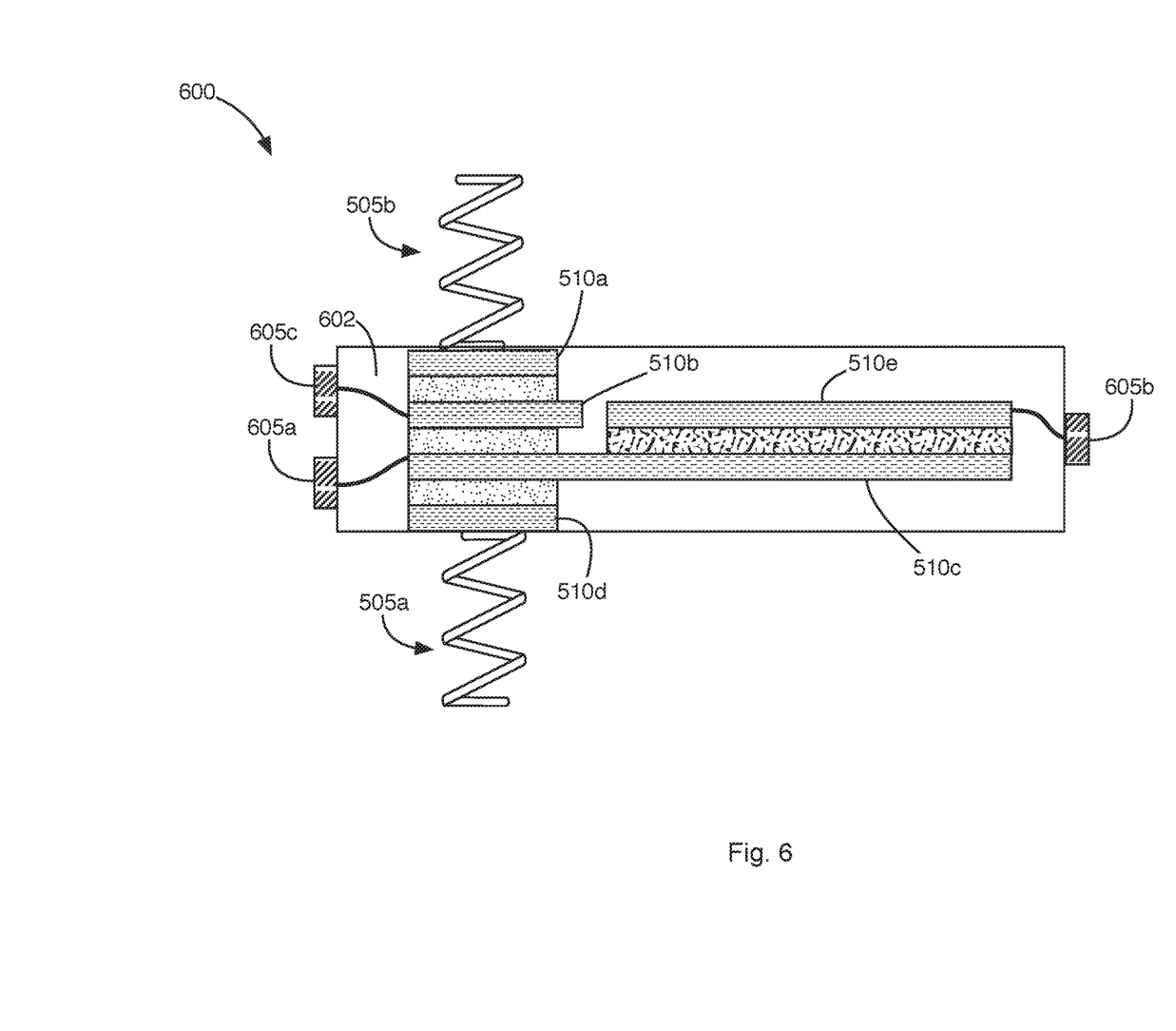
FIG. 6 illustrates a second device that includes the assembly of FIG. 5.

FIG. 6 illustrates a second device 600 that includes the assembly 500 illustrated in FIG. 5 and an encapsulating material 602 that surrounds part or all of the items that form the assembly 500. The encapsulating material 602 may correspond to the encapsulating material 302 described above or a different material.

First, second, and third terminals 605abc may be provided on the outside of the encapsulating material 602. The terminals 605abc may be formed in a similar manner as the terminals 305ab, describe above. In the exemplary embodiment, the first terminal 605a may be coupled to the third conductive layer 510c of the assembly 500, the second terminal 605b may be coupled to the fifth conductive layer 510e of the assembly 500, and the third terminal 605c may be coupled to the second conductive layer 510b of the assembly 200.

Similar to above, the first and second resilient members 505ab may be coupled to the first conductive layer 510a and fourth conductive layer 510d, respectively, prior to encapsulation. The encapsulating material may cover respective portions of the resilient members 505ab that are coupled to the respective conductive layers while other portions of the resilient members 505ab are allowed to protrude.

In alternate implementations, third and fourth terminals (not shown) may be provided on the outside of the encapsulating material 602 and electrically coupled to the first conductive layer 510a and the fourth conductive layer 510d, respectively. In a second process, the resilient members 505ab may be soldered, welded, etc., to the respective conductive layers. Alternatively, the resilient members 505ab may be pressed up against the respective terminals when the device 600 is inserted into a motor housing, and subsequently released when the device 600 is in the appropriate position within the motor housing. The resilient members 505ab may then expand to provide an electrical connection between the third terminal and the motor housing.

In yet another implementation, the first conductive layer 510a and the fourth conductive layer 510d may be electrically coupled together within the encapsulating material 602 and a single terminal (not shown) may be provided on the outside of the encapsulating material 602 and electrically coupled to one of the first conductive layer 510a and the fourth conductive layer 510d. In this implementation, a single resilient member may be utilized rather than two resilient members to couple the terminal to the motor housing.

Figure 7:
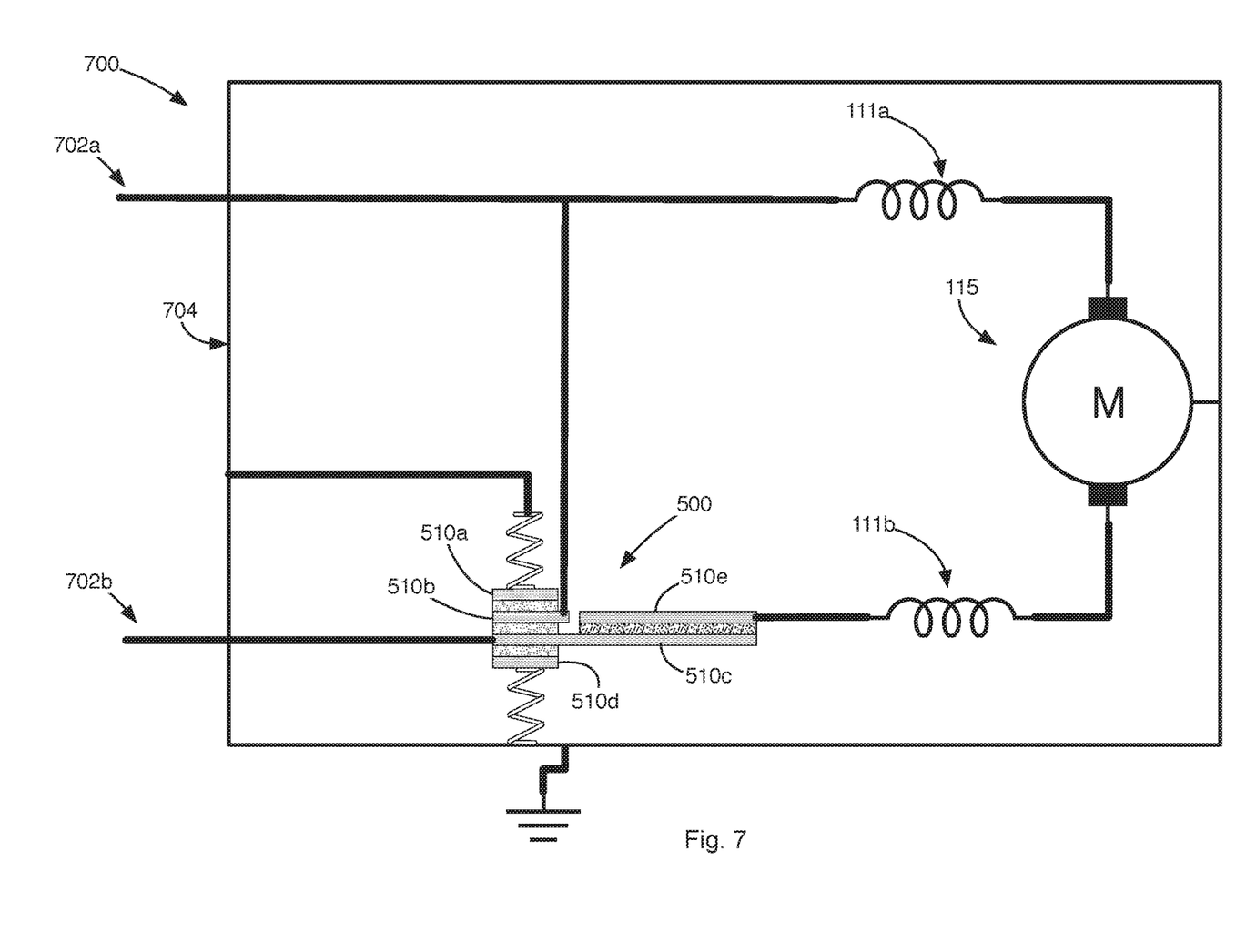
FIG. 7 illustrates is an exemplary schematic diagram of a second motor assembly that illustrates the connections between the assembly of FIG. 5 and a motor.

FIG. 7 illustrates an exemplary schematic diagram of a second motor assembly 700 that illustrates the connections between the assembly 500 of FIG. 5, a motor 115, and a conductive motor housing 704. As shown, the first conductive layer 510a and fourth conductive layer 510d may be electrically coupled to a ground node of the motor assembly 700 (e.g., a motor housing 704). As such, the first and second capacitors 507ab of the assembly 500 may perform the function of capacitors 107a and 107b, respectively, illustrated in FIG. 1.

The third conductive layer 510c may be electrically coupled to a second terminal 702b of the motor assembly 700 and the fifth conductive layer 510e may be electrically coupled to one end of a choke 111b that is coupled to a first terminal of a motor 115. As such, the PPTC 500 component of the assembly 500 may perform the function of the PPTC component 109 illustrated in FIG. 1.

The second conductive layer 510b may be electrically coupled to a first terminal 702a of the motor assembly 700.

As such, the varistor 509 of the assembly 500 may perform the function of the varistor 105 illustrated in FIG. 1.

As shown, the assembly 700 advantageously replaces four components of the system in FIG. 1 with just one device. This in turn reduces the number of leads normally required to couple the replaced components, which necessarily reduces the number of steps required to manufacture the motor assembly. EMI is further reduced by reducing the number of leads between components.

While an electromagnetic interference suppression component and protection component assembly for a motor has been described with reference to certain embodiments, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. For example, the various layers in the embodiments that define the components (i.e., capacitor, PPTC, and varistor) may be rearranged in a multitude of ways while still maintaining close coupling between the components. In addition, different components may be interposed between the layers to add additional functionality to the embodiments. Therefore, the claims should not be construed as being limited to any one of the particular embodiments disclosed, but to any embodiments that fall within the scope of the claims.

What is claimed is:

1. An electromagnetic interference (EMI) circuit assembly comprising:
    a first, a second, a third, a fourth and a fifth conductive layer;
    a first dielectric layer disposed between the first and the second conductive layers to thereby define a first capacitor;
    a voltage-dependent resistive material layer disposed between the second and the third conductive layers to thereby define a varistor;
    a second dielectric layer disposed between the third and the fourth conductive layers to thereby define a second capacitor; and
    a protection component disposed between the third and the fifth conductive layers to configured to protect a load from one or both of an overcurrent condition and an over temperature condition.

2. The EMI circuit assembly according to claim 1, wherein the protection component corresponds to one of: a polymeric positive temperature coefficient (PPTC) material layer disposed between the third and the fifth conductive layers to thereby define a PPTC component, a bimetal device, and a thermal cutout (TCO) component.

3. The EMI circuit assembly according to claim 1, further comprising a first resilient member electrically coupled to the first conductive layer and a second resilient member electrically coupled to the fourth conductive layer to facilitate electrically coupling a side of the first capacitor and a side of the second capacitor to a ground node.

4. The EMI circuit assembly according to claim 3, wherein the first and the second resilient members correspond to a spring formed of a conductive material.

5. The EMI circuit assembly according to claim 1, wherein the conductive layers are formed of at least one of: copper, copper steel, and brass.

6. The EMI circuit assembly according to claim 1, wherein the dielectric layer is formed of at least one of: a ceramic and a polymer film.

7. The EMI circuit assembly according to claim 1, further comprising:
    a housing that houses the first, second, third, fourth, and fifth conductive layers, the protection component, the first and second dielectric layers; and the voltage-dependent resistive material layer;
    first, second, and third terminals disposed on an outside surface of the housing, wherein:
    the first terminal is electrically coupled to the third conductive layer,
    the second terminal is electrically coupled to the fifth conductive layer,
    the third terminal is electrically coupled to the second conductive layer, and
    the fourth terminal is electrically coupled to both the first conductive layer and the fourth conductive layer.

8. A motor assembly comprising:
    a motor housing formed at least partially of a conductive material, the motor housing includes a first and a second terminal for receiving power;
    an electric motor disposed within the housing, the electric motor includes first and second power terminals;
    an EMI circuit assembly according to claim 1 disposed within the motor housing, wherein:
    the first and fourth conductive layers of the EMI circuit assembly are electrically coupled to the motor housing,
    the second conductive layer of the EMI circuit assembly is electrically coupled to the first terminal of the electrical motor and the first terminal of the motor housing;
    the third conductive layer of the EMI circuit assembly is electrically coupled to the second terminal of the motor housing, and
    the fifth conductive layer of the EMI circuit assembly is electrically coupled to the second power terminal of the electric motor.

* * * * *